United States Patent
Nakanishi

(10) Patent No.: US 8,461,920 B2
(45) Date of Patent: Jun. 11, 2013

(54) SEMICONDUCTOR INTEGRATED CIRCUIT DEVICE

(75) Inventor: Kazuyuki Nakanishi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/427,178

(22) Filed: Mar. 22, 2012

(65) Prior Publication Data
US 2012/0256680 A1    Oct. 11, 2012

(30) Foreign Application Priority Data

Apr. 6, 2011  (JP) .................................. 2011-084331

(51) Int. Cl.
*H01L 25/00*       (2006.01)
(52) U.S. Cl.
USPC ............................. 327/565; 327/566; 257/532
(58) Field of Classification Search
USPC ................... 327/565, 566, 594; 257/296, 306, 257/E27.048, 535, 532, E21.396, E27.013, 257/204
See application file for complete search history.

(56) References Cited

U.S. PATENT DOCUMENTS

| | | | |
|---|---|---|---|
| 2007/0075341 A1* | 4/2007 | Pan | 257/287 |
| 2007/0108554 A1* | 5/2007 | Hou et al. | 257/532 |
| 2007/0205451 A1 | 9/2007 | Mizushino et al. | |
| 2007/0252217 A1 | 11/2007 | Oki | |
| 2009/0302422 A1 | 12/2009 | Kanari | |
| 2010/0148304 A1* | 6/2010 | Rahim et al. | 257/532 |
| 2010/0252911 A1* | 10/2010 | Furuta | 257/532 |
| 2011/0133253 A1* | 6/2011 | Nakanishi et al. | 257/204 |
| 2011/0215390 A1* | 9/2011 | Kim et al. | 257/306 |
| 2011/0272782 A1* | 11/2011 | Yang | 257/532 |
| 2012/0286341 A1* | 11/2012 | Chen et al. | 257/296 |

FOREIGN PATENT DOCUMENTS

| JP | 2007-234857 | 9/2007 |
|---|---|---|
| JP | 2007-299860 | 11/2007 |

* cited by examiner

*Primary Examiner* — Lincoln Donovan
*Assistant Examiner* — Jung H Kim
(74) *Attorney, Agent, or Firm* — Panasonic Patent Center

(57) ABSTRACT

A layout for a semiconductor integrated circuit device can maintain a sufficient capacitance of a capacity cell even when a height of the cell is lowered. In this layout, power supply wiring extending along a first direction supplies a first supply voltage, power supply wiring and power supply wiring extending in parallel with the power-supply wiring supply a second and a third supply voltages respectively. Capacitive element is formed of a transistor that receives the first supply voltage at its source and drain, and receives the second or the third supply voltages at its gate. Capacitive element is disposed under power supply wiring such that it strides over a portion at power supply wiring side and a portion at power supply wiring side.

15 Claims, 12 Drawing Sheets

SEMICONDUCTOR INTEGRATED CIRCUIT DEVICE

BACKGROUND

1. Technical Field

The present invention relates to a layout of a semiconductor integrated circuit device having a decoupling capacity for preventing a malfunction caused by power supply noises.

2. Background Art

A conventional semiconductor device has achieved a variety of circuit units, which implement desirable functions, through the placement, at will, of transistors having various widths and lengths. The circuit unit is referred to as a cell, and the cells are combined and wired together to form an LSI (large scale integration).

In recent years, the LSI has undergone a rapid progress in a finer micro-process and a higher dense integration. This market trend has entailed a lower operating voltage and a higher operating frequency. For instance, the LSI thus requires performance such as a process rule of 0.1 µm or less, an operating voltage of 1.2V or less, and an operating frequency of several hundreds MHz or greater.

However, the higher frequency invites the greater noises, and the lower operating voltage invites the weaker resistance to noises, so that the LSI of nowadays tends to encounter a malfunction caused by noises.

One of methods for preventing a circuit from a malfunction caused by noises is to provide a decoupling capacity between power supplies of the circuits. A cell having such a decoupling capacity is referred to as a capacity cell.

FIG. 13 shows a plan view illustrating a layout of a conventional capacity cell. In FIG. 13, a drain and a source of PMOS transistor 99 are connected to power supply wiring 96, and a gate thereof is connected to ground wiring 95, so that PMOS transistor 99 can stay in a conductive state.

As a result, a gate electrode as a first polarity, a channel as a second polarity formed on a semiconductor substrate under the gate electrode, whereby PMOS transistor 99 works as a capacitive element.

A drain and a source of NMOS transistor 98, on the other hand, are connected to ground wiring 95, and a gate thereof is connected to power supply wiring 96, so that NMOS transistor 98 can stay in a conductive state. As a result, a gate electrode as a first polarity, a channel as a second polarity formed on a semiconductor substrate under the gate electrode, whereby NMOS transistor 98 works as a capacitive element. (Refer to Patent Literature 1: Unexamined Japanese Patent Application Publication No. 2007-234857.)

SUMMARY

More effective control of voltage variation in a power supply wiring and in a ground wiring needs an increment in a capacitance per unit portion. A capacity cell preferably includes both of a capacitive element formed of a PMOS transistor and a capacitive element formed of an NMOS transistor so that the advantage of the more effective control can be obtained at both of the power supply wiring and the ground wiring.

A height of a standard logic cell needs to be lowered for reducing a chip area. The lower height of the cell results in a reduction in a transistor width, which can be extended in a cell height direction, and a reduction in the number of metal wirings to be placed in the cell along a vertical direction relative to the cell height direction.

The foregoing results invite a reduction in capacitance of the capacity cell shown in FIG. 13. To be more specific, in the structure as shown in FIG. 13, where NMOS transistor 98 confronts PMOS transistor 99, the reduction in the cell height causes a problem of an insufficient space between the gates of transistors 98 and 99, or a problem of insufficient gate widths of transistors 98 and 99.

To avoid the foregoing problems, as shown in FIG. 14, the capacity cell can be formed of only NMOS transistor 98 (or only PMOS transistor 99) in some case. In this case, a capacitance per unit portion decreases, so that the resistance against the variation in the power supply voltage and the ground voltage is undesirably weakened.

The present invention addresses the foregoing problem, and aims to provide a layout of a semiconductor integrated circuit device for maintaining a sufficient capacity of a capacity cell even when a cell height is lowered.

In one aspect of the present invention, a semiconductor integrated circuit device includes the following structural elements:

a first power supply wiring extending along a first direction for supplying a first supply voltage;

a second power supply wiring extending in parallel with the first power supply wiring for supplying a second supply voltage;

a third power supply wiring disposed opposite to the second power supply wiring with respect to the first power supply wiring and extending in parallel with the first power supply wiring for supplying a third supply voltage; and a first capacitive element formed of a transistor of which source and drain receive the first supply voltage, and of which gate receives one of the second or the third supply voltage. The first capacitive element is formed under the first power supply wiring and is located on a portion at the second power supply wiring side and a portion of the third power supply wiring side.

According to the foregoing aspect, the first capacitive element, which includes a transistor having a decoupling capacity, is formed under the first power supply wiring and is located on the portion at the second power supply wiring side and the portion at the third power supply wiring side. In other words, the first capacitive element is formed such that it extends across the first power supply wiring. This structure allows obtaining a greater gate width of the transistor that forms the capacitive element than a conventional capacity cell in which a transistor is interposed between power supply wirings. As a result, the capacity can be maintained great enough even when the space between the power supply wirings is narrowed due to a decrease in the cell height.

The present invention thus allows maintaining a sufficient capacity even when the cell height is lowered, so that the power-supply noises can be reduced more effectively.

DESCRIPTION OF EMBODIMENTS

Exemplary embodiments of the present invention are demonstrated hereinafter with reference to the accompanying drawings.

Embodiment 1

Figure 1:
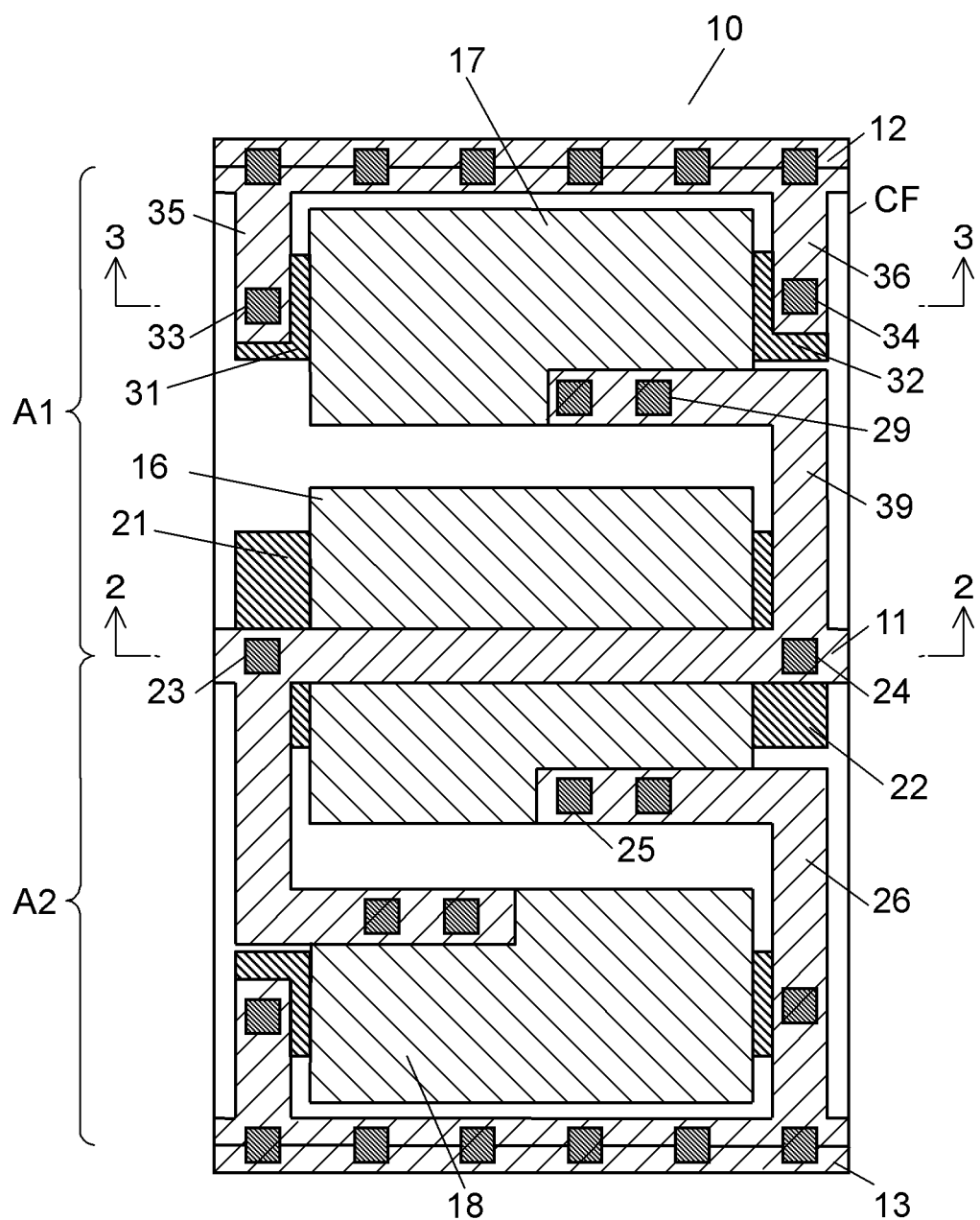
FIG. 1 is a plan view illustrating a layout of a capacity cell in accordance with embodiment 1 of the present invention.

FIG. 1 is a plan view illustrating a layout of a capacity cell in accordance with the first embodiment. The capacity cell shown in FIG. 1 and other cells are disposed for forming a semiconductor integrated circuit device in accordance with the first embodiment. In this embodiment, assume that respective metal wirings are provided to a first layer.

In FIG. 1, capacity cell 10 is formed in cell frame CF having a double-height structure. Cell frame CF is formed by layering two circuit portions A1 and A2, along a vertical direction in FIG. 1. Each of the two circuit portions A1 and A2 has a single height structure. The double height structure shown in FIG. 1 is formed by layering circuit portions A1 and A2, both having the single height structure, in the vertical direction of FIG. 1 with an N-well shared with each other. Not to mention, a circuit portion with single height structure is disposed adjacently to another one with a P-well shared with each other, thereby forming a double-height structure.

In FIG. 1, metal wiring 11 (first power supply wiring) is disposed at a center of cell frame CF such that it extends in a lateral direction (first direction) in FIG. 1, and metal wiring 11 supplies power-supply voltage VDD (first supply voltage). Metal wiring 12 as a second power supply wiring is disposed on an upper end of cell frame CF and it extends in parallel with metal wiring 11, namely, along the lateral direction in FIG. 1. Metal wiring 13 as a third power supply wiring is disposed on an lower end of cell frame CF and it extends in parallel with metal wiring 11 along the lateral direction in FIG. 1. Metal wiring 12 supplies ground voltage VSS as a second supply voltage, and metal wiring 13 supplies ground voltage VSS as a third supply voltage. P-type diffusion portion 21 is connected to metal wiring 11 via contact 23 formed in an insulating layer, and P-type diffusion portion 22 is connected to metal wiring 11 via contact 24 formed in the insulating layer. In this embodiment, metal wirings 12 and 13 are supposed to supply the same voltage; however, they can supply different voltages from each other in some cases.

In cell frame CF, first capacitive element 16 is disposed under metal wiring 11. First capacitive element 16 is formed of a PMOS transistor provided on a N-well, and is disposed on circuit portion A1 that is located at metal wiring 12 side, and also on circuit portion A2 that is located at metal wiring 13 side. In other words, first capacitive element 16 strides over circuit portions A1 and A2 in cell frame CF that has the double-height structure, whereby its transistor width can be greater than that of the single-height structure.

Figure 2:
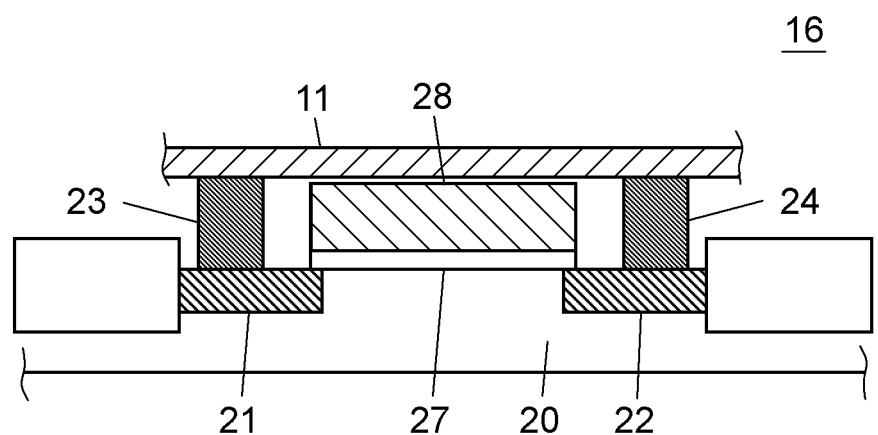
FIG. 2 is a sectional view cut along line 2-2 in FIG. 1.

FIG. 2 is a sectional view illustrating a structure of first capacitive element 16 cut along line 2-2 shown in FIG. 1. As shown in FIG. 2, first capacitive element 16 includes the following structural elements:

P-type diffusion portions 21 and 22 forming a drain terminal and a source terminal on N-well 20;

insulating layer 27; and poly-silicon layer 28 forming a gate terminal oppositely to N-well 20 with respect to insulating layer 27.

P-type diffusion portion 21 is connected to metal wiring 11 via contact 23 formed in the insulating layer, and P-type diffusion portion 22 is connected to metal wiring 11 via contact 24 formed in the insulating layer. This structure allows metal wiring 11 to feed supply voltage VDD to the drain and the source of the PMOS transistor that forms first capacitive element 16.

Poly-silicon layer 28 is connected, via contact 25 formed in the insulating layer, to wiring 26 led out from metal wiring 13 as shown in FIG. 1, so that the gate of the PMOS transistor that forms first capacitive element 16 receives ground voltage VSS from metal wiring 13. As a result, first capacitive element 16 forms a channel on a surface of N-well 20 under insulating layer 27, and this channel together with poly-silicon layer 28 working as a gate electrode forms a decoupling capacity.

In cell frame CF, second capacitive element 17 formed of an NMOS transistor placed on the P-well is disposed between first capacitive element 16 and metal wiring 12. In a similar way, third capacitive element 18 formed of an NMOS transistor on the P-well is disposed between first capacitive element 16 and metal wiring 13.

Figure 3:
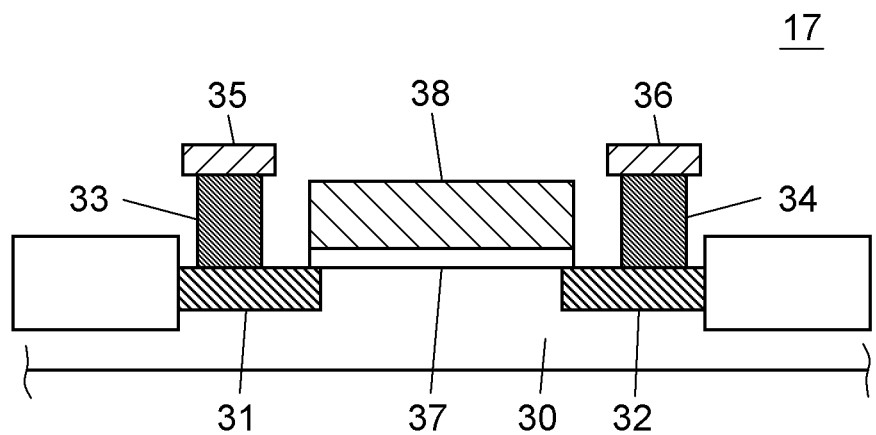
FIG. 3 is a sectional view cut along line 3-3 in FIG. 1.

FIG. 3 is a sectional view cut along line 3-3 in FIG. 1 for illustrating a structure of second capacitive element 17. The structure in a sectional view of third capacitive element 18 is similar to that shown in FIG. 3. As shown in FIG. 3, second capacitive element 17 includes the following structural elements:

N-type diffusion portions 31 and 32 forming a drain terminal and a source terminal on P-well 30 and;

insulating layer 37; and poly-silicon layer 38 forming a gate terminal and disposed oppositely to P-well 30 with respect to insulating layer 37.

N-type diffusion portion 31 is connected to wiring 35 led out from metal wiring 12 via contact 33 formed in the insulating layer, and N-type diffusion portion 32 is connected to wiring 36 led out from metal wiring 12 via contact 24 formed in the insulating layer. This structure allows metal wiring 12 to feed ground voltage VSS to the drain and the source of the NMOS transistor that forms second capacitive element 17.

Poly-silicon layer 38 is connected, via contact 29 formed in the insulating layer, to wiring 39 led out from metal wiring 11 as shown in FIG. 1, so that the gate of the NMOS transistor that forms second capacitive element 17 receives supply voltage VDD from metal wiring 11. As a result, second capacitive element 17 forms a channel on a surface of P-well 30 under insulating layer 37, and this channel together with poly-silicon layer 38 working as a gate electrode forms a decoupling capacity.

Figure 13:
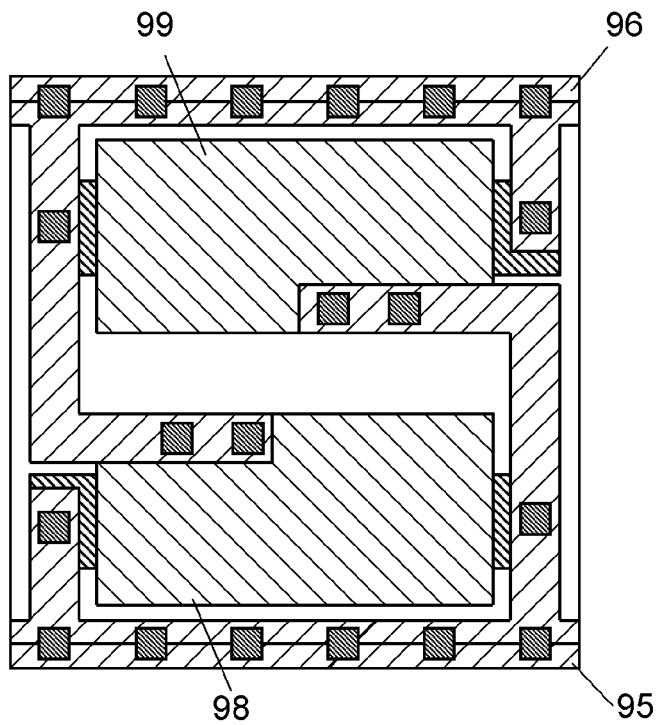
FIG. 13 is a plan view of a layout of a conventional capacity cell.
Figure 14:
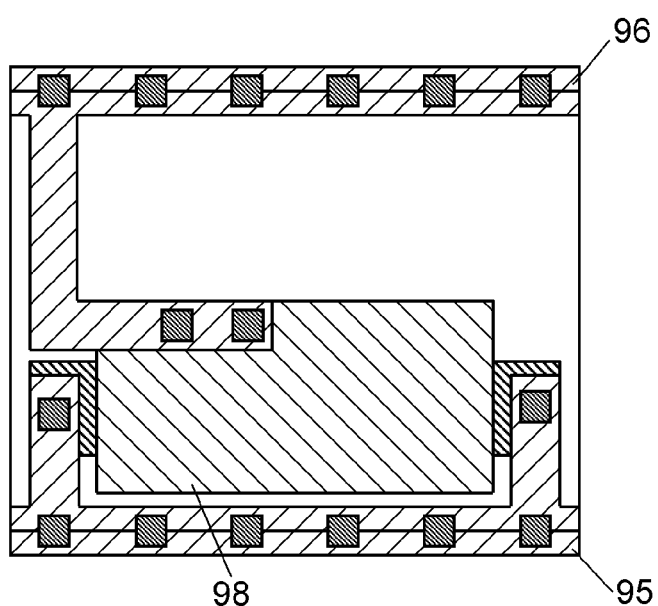
FIG. 14 is a plan view of a layout of a conventional capacity cell.

In the case of the conventional capacity cell shown in FIG. 13, a lower cell height entails a narrower transistor width, which inevitably results in a smaller capacity. However, capacity cell 10 having a double-height structure and in accordance with this embodiment allows disposing first capacitive element 16, formed of a transistor, under metal wiring 11 that is located at the center of the cell and works as a power supply wiring. First capacitive element 16 can be formed of a transistor having a greater capacity than the second capacitive element. This structure allows maintaining a capacity sufficient enough even when the cell height is lowered.

As shown in FIG. 1, metal wirings 12 and 13 are placed such that the respective centerlines thereof agree with the cell frame CF. In a case where another capacity cell is placed next to capacity cell 10 along the vertical direction in FIG. 1, the foregoing structure allows sharing metal wirings 12 and 13 with this another capacity cell free from changing the wiring widths.

As shown in FIG. 1, metal wiring 11 is disposed at the center of cell frame CF, so that metal wiring 11 is spaced away equidistantly from metal wiring 12 and from metal wiring 13. In a case where another cell with single-height structure is placed next to capacity cell 10 along the lateral direction in FIG. 1, the foregoing structure allows this another cell to be disposed in a simple layout. However, metal wiring 11 is not necessarily disposed at the center of cell frame CF.

In the structure shown in FIG. 1, second and third capacitive elements 17 and 18 can be omitted. For instance, third capacitive element 18 can be omitted and the space thereof remains vacant, or circuit components other than capacitive elements can be placed at the space.

In the structure shown in FIG. 1, the PMOS transistor forming first capacitive element 16 has a greater gate width than that of the NMOS transistors forming second and third capacitive elements 17 and 18; however, the structure is not limited to this one.

In the structure shown in FIG. 1, the PMOS transistor forming first capacitive element 16 has a gate length equal to that of the NMOS transistors forming second and third capacitive elements 17 and 18; however, the structure is not limited to this one.

In the structure shown in FIG. 1, metal wiring 13 feeds ground voltage VSS to the gate of the PMOS transistor forming first capacitive element 16; however, metal wiring 12 instead of metal wiring 11 can feed ground voltage VSS to the gate.

In the structure shown in FIG. 1, first capacitive element 16 is formed of a PMOS transistor; however, it can be formed of a NMOS transistor, of which source and drain receives ground voltage VSS from metal wiring 11, and metal wiring 12 or 13 can feed supply-voltage VDD.

Embodiment 2

Fine processes of process rule 65 nm and onward encounter weaker noise resistance caused by a thinner film of gate oxide, so that a probability of breakdown of the gate oxide film increases. On the other hand, a power-supply wiring or a ground wiring designed to have lower impedance tends to carry noises. Considering these facts, the foregoing problem of the breakdown of the gate oxide film is a serious concern about the structure shown in FIG. 1 where the gate terminal is directly connected with the power-supply wiring or the ground wiring.

It is thus desirable that a circuit for providing a stable voltage be disposed between the gate terminal and the power supply wiring or the ground wiring in order to prevent noises exceeding a rated withstanding voltage from entering the gate terminal so that supply voltage VDD and ground voltage VSS can be steadily supplied to the gate terminal. This circuit for supplying a voltage steadily is referred to as a TIE portion. The TIE portion feeds a voltage from a source to a receiver while the source is isolated electrically from the receiver. A presence of the TIE portion between the gate terminal and the power supply wiring or the ground wiring allows eliminating noises exceeding the rated withstanding voltage of the gate terminal.

Figure 4:
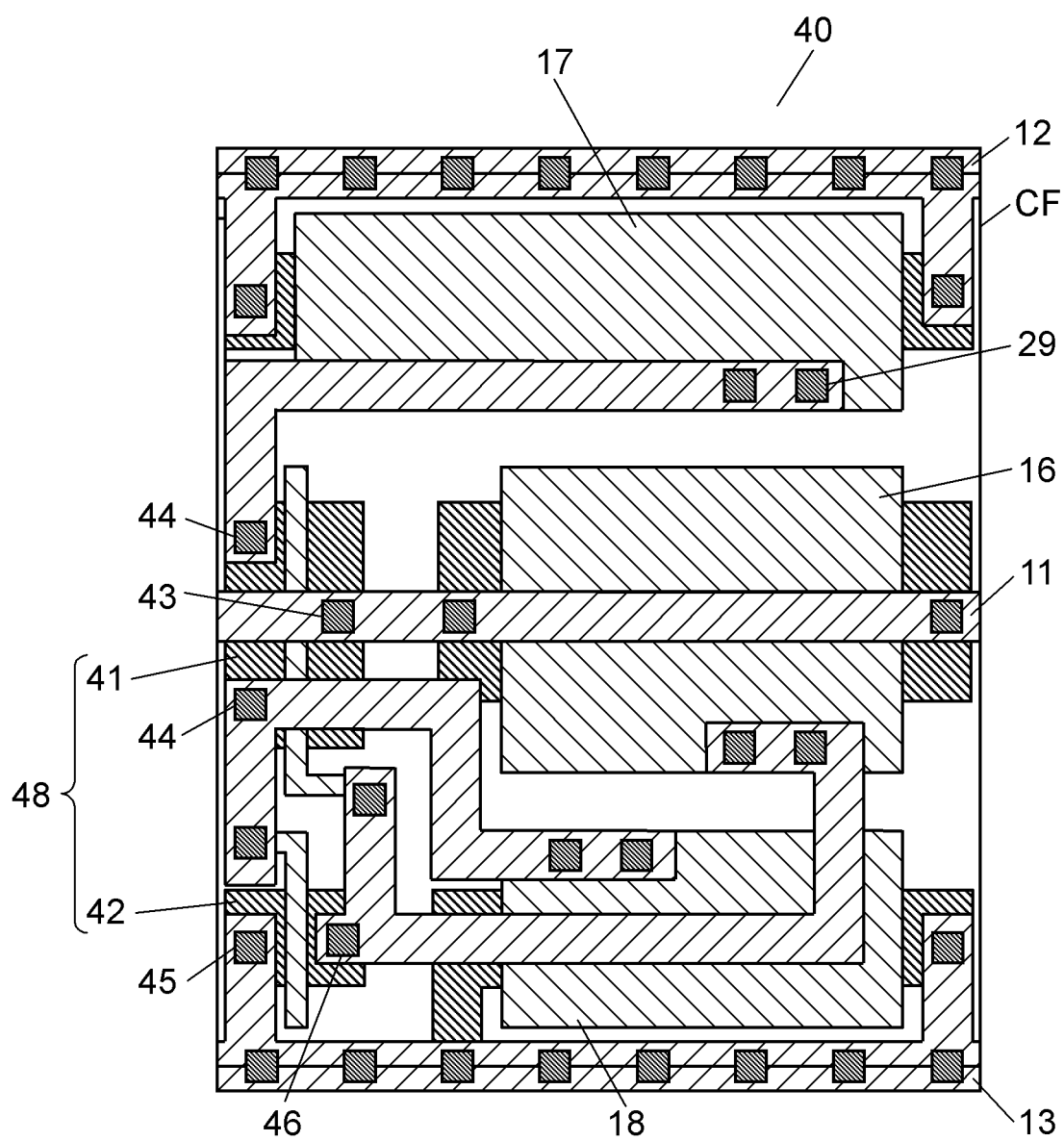
FIG. 4 is a plan view illustrating a layout of a capacity cell in accordance with embodiment 2 of the present invention.
Figure 5:
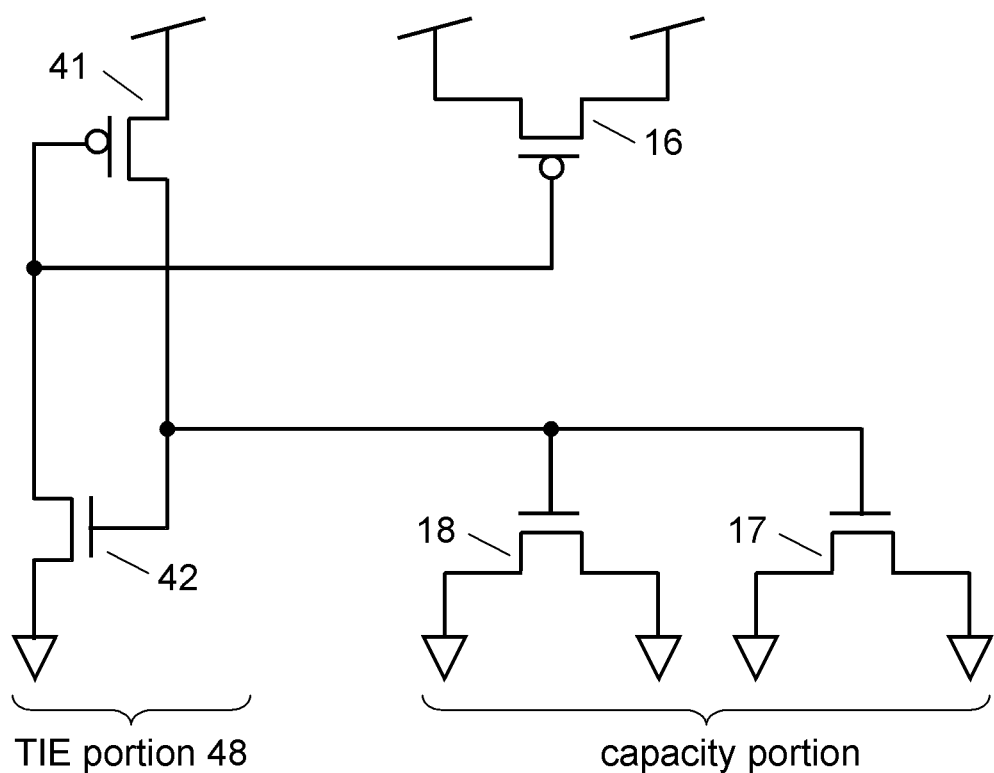
FIG. 5 is a circuit diagram of a structure (layout) shown in FIG. 4.

FIG. 4 is a plan view illustrating a layout of a capacity cell in accordance with the second embodiment, and FIG. 5 is a circuit diagram of the capacity cell shown in FIG. 4. Capacity cell 40 shown in FIG. 4 is formed of capacity cell 10 shown in FIG. 1 and TIE portion 48 that is formed of PMOS transistor 41 and NMOS transistor 42. As shown in FIG. 5, TIE portion 48 supplies ground voltage VSS to a gate of the PMOS transistor forming first capacitive element 16, TIE portion 48 feeds supply voltage VDD to gates of NMOS transistors forming second and third capacitive elements 17 and 18.

As shown in FIG. 4, a P-type diffusion portion forming a source terminal of PMOS transistor 41 is connected, via contact 43 formed in an insulating layer, to metal wiring 11 that feeds supply voltage VDD. Another P-type diffusion portion forming a drain terminal of PMOS transistor 41 is connected, via contact 44 formed in the insulating layer, to a gate terminal of NMOS transistor 42. An N-type diffusion portion forming a source terminal of NMOS transistor 42 is connected, via contact 45 formed in the insulating layer, to metal wiring 13 that feeds ground voltage VSS. Another N-type diffusion portion forming a drain terminal of NMOS transistor 42 is connected, via contact 46 formed in the insulating layer, to a gate terminal of PMOS transistor 41. To be more specific, PMOS transistor 41 receives supply-voltage VDD at the source, and NMOS transistor 42 receives ground voltage VSS at the source. The drain of PMOS transistor 41 is connected to the gate of NMOS transistor 42. The gate of PMOS transistor 41 is connected to the drain of NMOS transistor 42.

As a result, the foregoing structure works this way in a steady state: The drain terminal of PMOS 41 transistor outputs supply voltage VDD, and the drain terminal of NMOS transistor 42 outputs ground voltage VSS. The drain terminal, which outputs supply voltage VDD, of PMOS transistor 41 is connected with the gate terminals of the NMOS transistors forming second and third capacitive elements 17 and 18. The drain terminal, which outputs ground voltage VSS, of NMOS transistor 42 is connected with the gate terminal of the PMOS transistor forming first capacitive element 16.

The second embodiment thus proves that TIE portion 48, which is a circuit for supplying a voltage steadily, feeds supply voltage VDD or ground voltage VSS to the gates of the transistors forming capacitive elements 16, 17, and 18. This structure allows avoiding the problem of breakdown of the gate insulating film in the transistors forming the capacitive elements.

In this second embodiment, the TIE portion is formed of one PMOS transistor and one NMOS transistor; however, the structure is not limited to this instance. Any circuit, as far as it can eliminate noises and supply a voltage steadily, can be used as the TIE portion. For instance, another NMOS transistor can be connected in parallel with NMOS transistor 42.

In this embodiment described in FIG. 4, a gate length of the transistor forming capacitive element 16 is smaller than the gate length of the transistor forming capacitive element 17, so that the TIE portion can be placed next to capacitive element 16 for optimizing the layout.

In this embodiment, the TIE portion is disposed in capacity cell 40; however, the TIE portion can be disposed in another cell.

Embodiment 3

Figure 6:
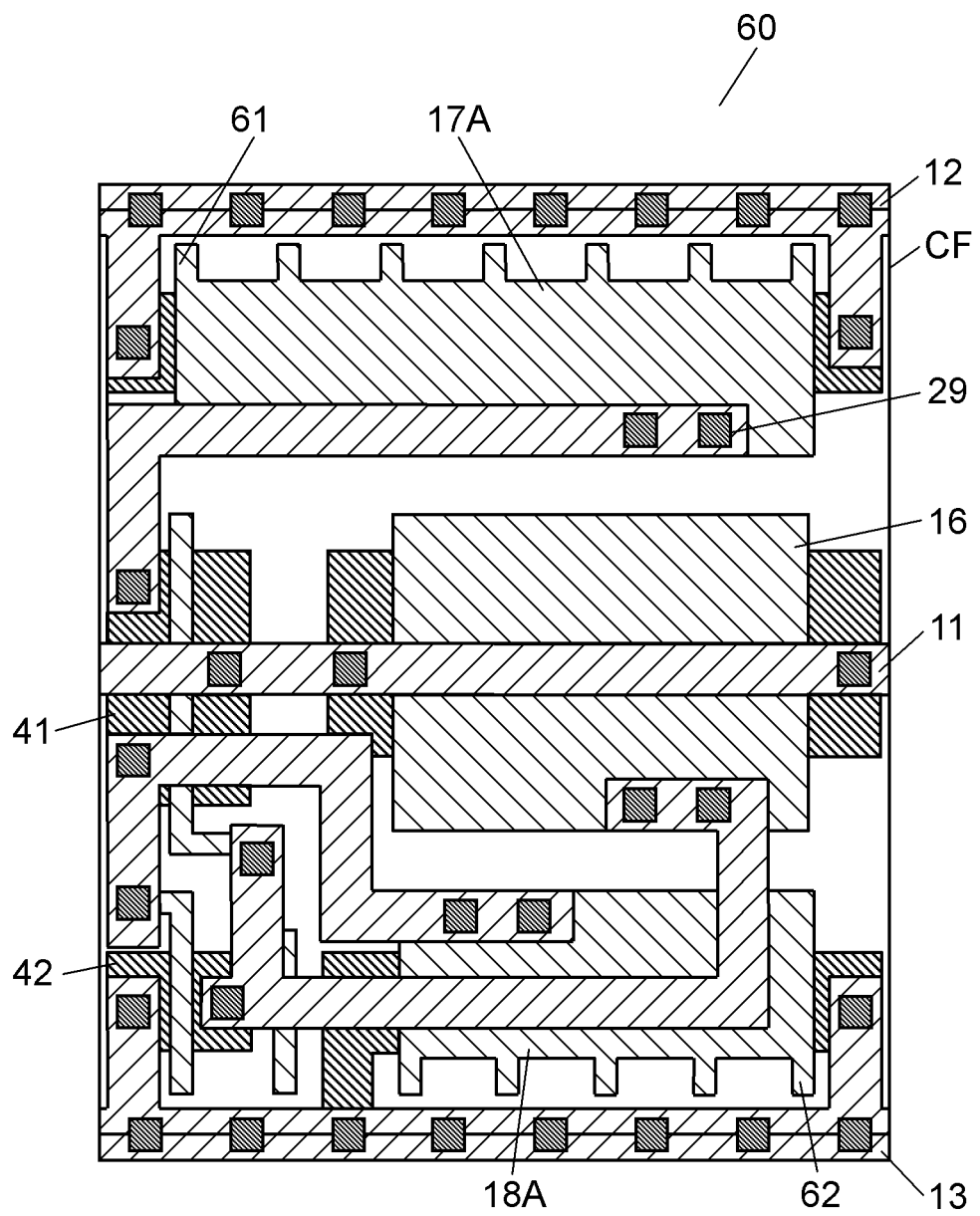
FIG. 6 is a plan view illustrating a layout of a capacity cell in accordance with embodiment 3 of the present invention.

FIG. 6 is a plan view illustrating a layout of a capacity cell in accordance with the third embodiment. The structure shown in FIG. 6 is similar to that shown in FIG. 4 except the shapes of gate patterns of second and third capacitive elements 17A and 18A. Structural elements similar to those in FIG. 4 have the same reference marks, and detailed descriptions thereof are omitted here.

Capacity cell 60 shown in FIG. 6 includes second capacitive element 17A formed of a transistor of which gate pattern has multiple projections 61 projecting toward metal wiring 12 along the vertical direction in FIG. 6. Respective projections 61 are placed at intervals equal to each other, and have widths equal to each other along the lateral direction in FIG. 6. The tips of respective projections 61 are positioned vertically in FIG. 6 at the same location and aligned laterally. In a similar way, a transistor forming third capacitive element 18A has multiple projections 62 projecting toward metal wiring 13 along the vertical direction in FIG. 6, and respective projections 62 are placed at intervals equal to each other, and have widths equal to each other along the lateral direction in FIG. 6. The tips of respective projections 62 are positioned vertically in FIG. 6 at the same location and aligned laterally.

In the capacity cell, transistors having great gate lengths are placed, so that the fine processes of process rule of 32 nm and onward encounter a problem, i.e. a gate pattern greatly affects, due to photo-approaching effect, the dimensional accuracy of the transistors in other cells placed around the capacity cell. For instance, in a case where other cells are placed adjacently to (on the top face or on the underside of) capacity cell 40 shown in FIG. 1, the shape of the gate pattern of the transistor forming second or third capacitive element 17 or 18 affects the gate shape of the cell next to the capacity cell.

It is thus desirable for the fine processes of process rule 32 nm and onward that a shape regularity of gate pattern be maintained at the vicinity of boundaries between the cells in order to obtain an accuracy of the gate length. For this purpose, in capacity cell 60 shown in FIG. 6, the gate patterns of the transistors forming second and third capacitive elements 17A and 18A have multiple projections 61 and 62 that project regularly outward of the cell.

Figure 7:
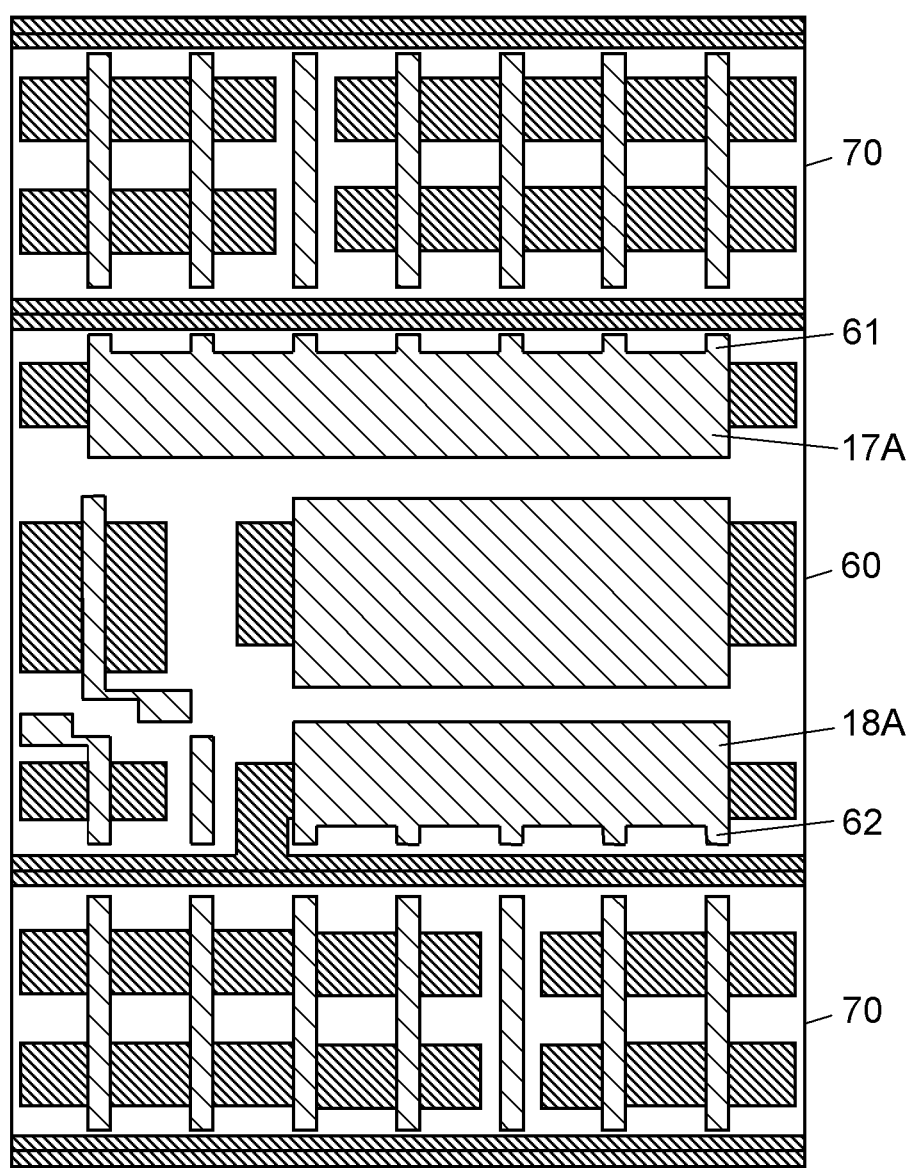
FIG. 7 shows a layout in which the capacity cell shown in FIG. 6 is sandwiched by other cells vertically.

FIG. 7 shows an example where other cells 70 are placed adjacently both upside and downside of capacity cell 60 shown in FIG. 6. As shown in FIG. 7, placement of capacity cell 60 allows maintaining the shape regularity relative to the gate patterns confronting to that of cell 70 at the boundaries between the cells. This structure thus prevents positively the dispersion in gate lengths caused by the photo-approaching effect.

In this third embodiment, a capacity cell including the TIE portion is taken as an example; however, a capacity cell that has no TIE portion as shown in FIG. 1 can produce an advantage similar to what is discussed above as far as a transistor forming the capacity cell has projections projecting regularly outward of the cell.

In the structure shown in FIG. 6, both of second and third capacitive elements 17A and 18A include projections 61 and 62; however, the projections can be provided to either one of the capacitive elements.

Independent of the gate pattern of the transistor forming the capacitive element, a coronary dummy gate pattern can be provided. For instance, in the structure shown in FIG. 1, a dummy pattern can be disposed between second capacitive element 17 and metal wiring 12. This dummy pattern has a main pattern extending laterally in FIG. 1 and multiple projections projecting from the main pattern upward in FIG. 1. In this case, an advantage similar to what is discussed in FIG. 6 is obtainable.

In the respective embodiments discussed previously, metal wiring 11 that feeds supply-voltage VDD is disposed at the center of the cell, and metal wirings 12 and 13 that feed ground voltage VSS are placed on the upper and lower ends of cell frame CF. However, the power supply wiring and the grounding wiring can be placed upside down with a similar advantage maintained. In this case, the NMOS transistor is placed under the ground wiring placed at the center of the cell, and the PMOS transistors can be placed near the power supply wirings disposed on the upper and lower ends of the cell. Here is another instance, although wiring connections become complicated, the power supply wiring and the ground wiring only are placed in reverse location to what is discussed previously, and the PMOS transistor is placed under the ground wiring at the center of the cell and the NMOS transistors are placed near the power supply wirings disposed on the upper and lower ends of the cell.

Other Structures

Figure 8:
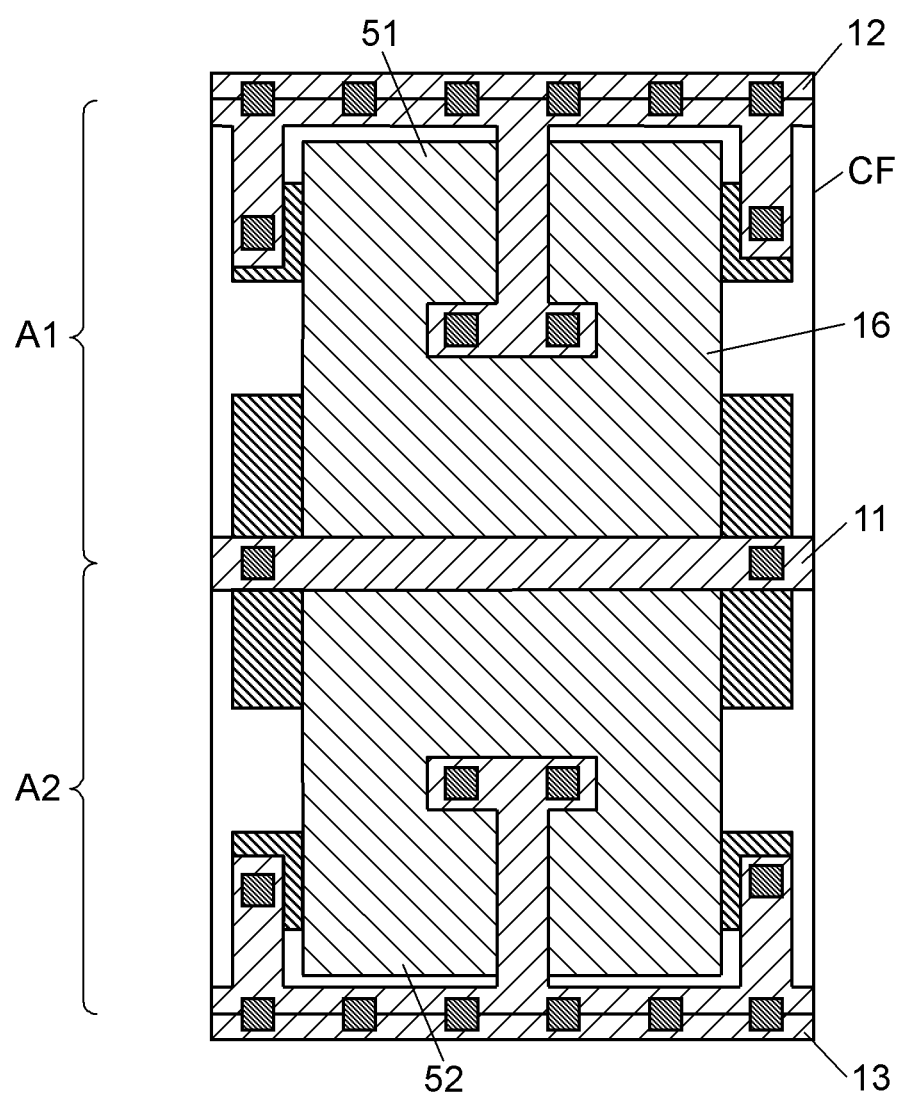
FIG. 8 is a plan view illustrating a layout in which a capacitance element and an off-transistor are placed together.

In the capacity cell discussed above, an off-transistor can be disposed in addition to the capacitive elements. For instance, in a structure shown in FIG. 8, off-transistors 51, 52 are placed to replace second and third capacitive elements 17 and 18 shown in FIG. 1. A gate of off-transistor 51 receives ground voltage VSS from metal wiring 12, and a gate of off-transistor 52 receives ground voltage VSS from metal wiring 13. In the structure shown in FIG. 8, first capacitive element 16, off-transistors 51, 52 share an integrated gate pattern with each other; however, the gate pattern can be separated from each other.

Figure 9:
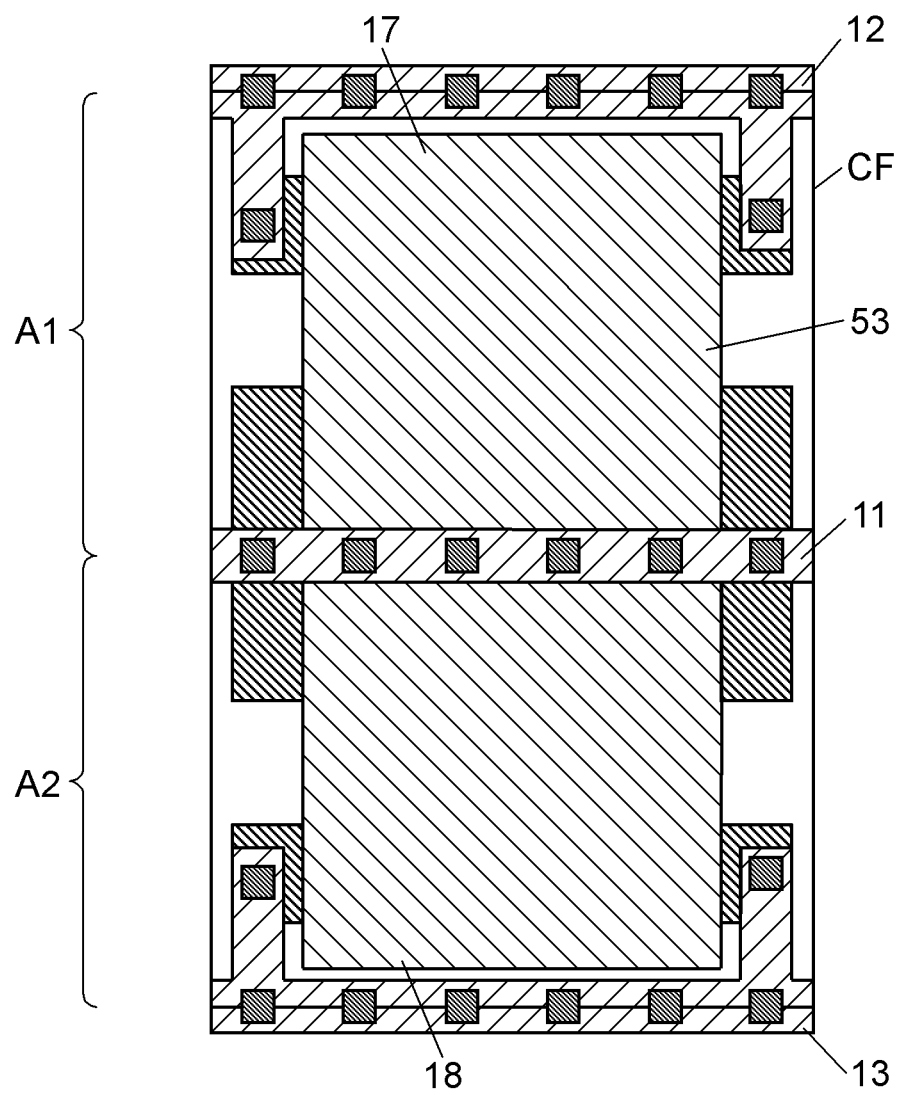
FIG. 9 is a plan view illustrating a layout in which a capacitance element and an off-transistor are placed together.

In the structure shown in FIG. 9, off-transistor 53 is disposed to replace first capacitive element 16. A gate of off-transistor 53 receives supply-voltage VDD from metal wiring 11. In the structure shown in FIG. 9, second and third capacitive elements 17, 18, and off-transistors 53 share an integrated gate pattern with each other; however, the gate pattern can be separated from each other.

Figure 10:
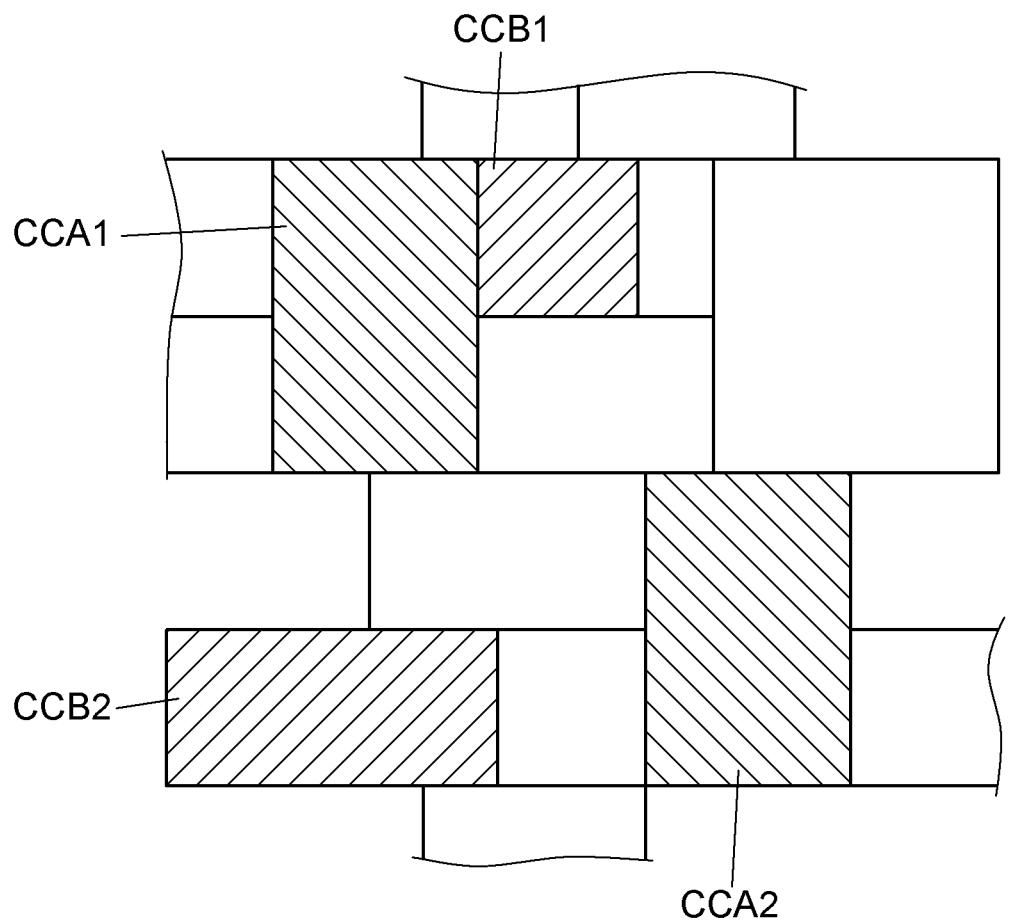
FIG. 10 is a plan view of a layout in which capacity cells with double-height structure and capacity cells with single-height structure coexist with each other.

The capacity cell with double-height structure can coexist with a capacity cell with single-height structure and both of them can be placed in a logic portion. FIG. 10 shows a layout where capacity cells with double-height structure coexist with capacity cells with single-height structure. Solid lines in FIG. 10 represent boundaries between the cells. In FIG. 10, capacity cells CCA1, CCA2 with double-height structure and capacity cells CCB1, CCB2 with single-height structure are disposed. Assume that capacity cell CCA1 working as a first cell and has the structure shown in FIG. 1. Capacity cell CCB1 working as a second cell includes a capacitive element formed of a transistor disposed between metal wiring 11 and metal wiring 12. A placement of the capacity cell with single-height structure in a vacant portion that cannot accept a capacity cell with double-height structure, whereby the resistance against power-supply noise can be further strengthened.

The respective embodiments discussed previously refer to the capacity cell with double-height structure, and the same structure (layout) can be applicable to the cell of which height is as high as N times (N is an integer equal to 3 or greater than 3) of a height of a regular cell, and in this case, a similar advantage to what is discussed previously is obtainable.

Figure 11:
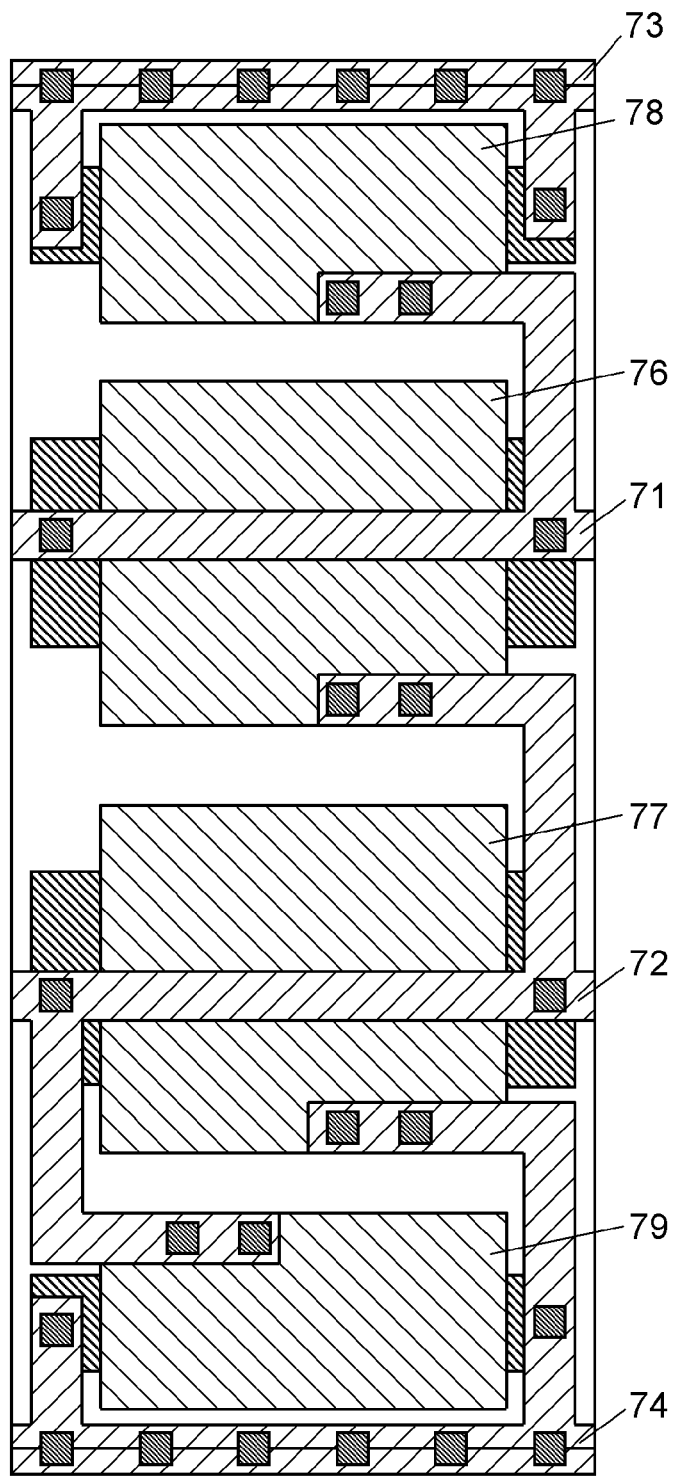
FIG. 11 is a plan view of a layout in which a capacity cell with triple-height structure.

FIG. 11 shows a layout of capacity cells of triple height structure, namely, the cells have a height three times as high as a height of a regular cell. In the structure shown in FIG. 11, capacitive element 76 is disposed under metal wiring 71 that supplies supply-voltage VDD. Capacitive element 76 is formed of a PMOS transistor disposed on N-well. Capacitive element 77 is disposed under metal wiring 72 that supplies ground voltage VSS. Capacitive element 77 is formed of an NMOS transistor disposed on P-well. Capacitive element 78 formed of an NMOS transistor is disposed between capacitive element 76 and metal wiring 73, and capacitive element 79 formed of a PMOS transistor is disposed between capacitive element 77 and metal wiring 74. The structure shown in FIG. 1 allows expanding the transistor width of first capacitive element 16, and the structure shown in FIG. 11 allows expanding the transistor widths of capacitive elements 76, 77, so that the structure shown in FIG. 11 can further increase the capacitance.

Figure 12:
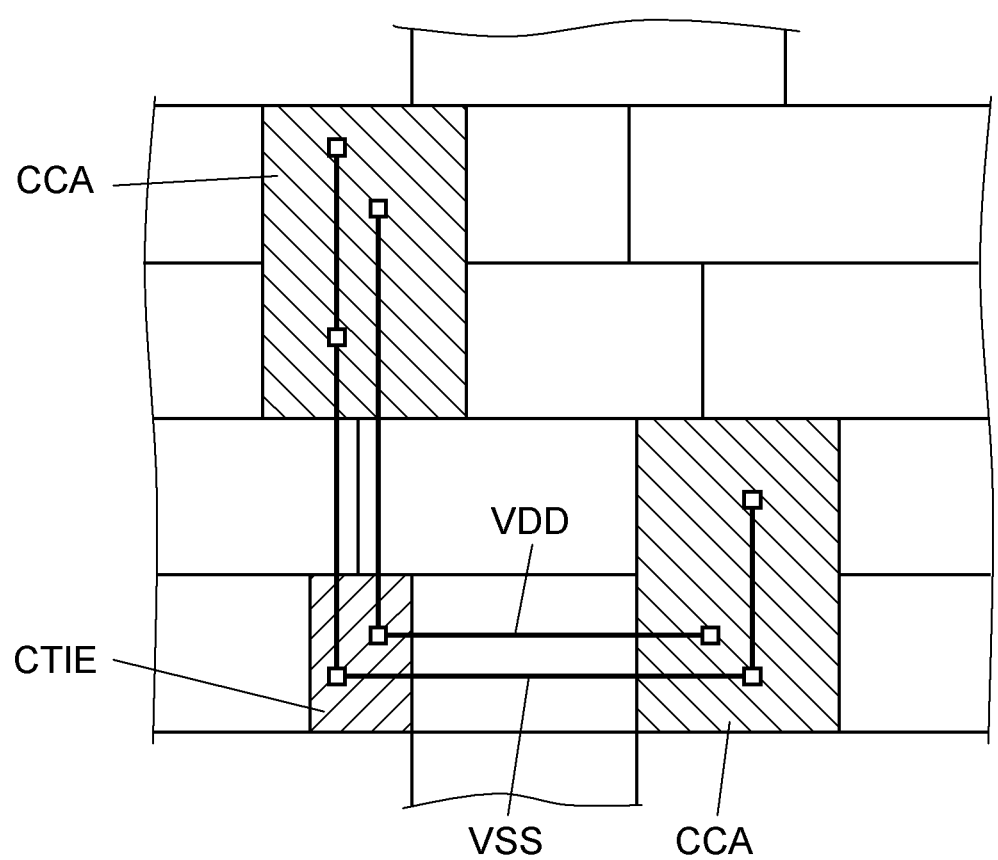
FIG. 12 is a plan view of a layout in which a TIE portion is formed independently of a capacity cell.

In the second embodiment, TIE portion 48 is formed inside capacity cell 40; however, the structure is not limited to this one, for instance, the cell including the TIE portion can be formed independent of the capacity cell. In the case of FIG. 12, one TIE cell CTIE including TIE portion is connected to two capacity cells CCA via cell-wiring. This example proves that multiple capacity cells CCA share one TIE cell CTIE with each other, thereby reducing the portion necessary for the layout.

The semiconductor integrated circuit device allows its capacity cell to maintain a sufficient capacitance even when the cell height is lowered, and allows reducing power-supply noises more effectively. The semiconductor integrated circuit device is thus useful for improving the performance of the LSI.

What is claimed is:

1. A semiconductor integrated circuit device comprising:
    a first power supply wiring extending along a first direction and supplying a first supply voltage;
    a second power supply wiring extending in parallel with the first power supply wiring and supplying a second supply voltage;
    a third power supply wiring disposed opposite to the second power supply wiring with respect to the first power supply wiring, extending in parallel with the first power supply wiring, and supplying a third supply voltage;
    a first capacitive element formed of a transistor of which source and drain receive the first supply voltage, and of which gate receives the second supply voltage or the third supply voltage;
    a second capacitive element formed of a transistor disposed between the first capacitive element and the second power supply wiring, the transistor having a source and a drain which receive the second supply voltage, and the transistor having a gate which receives the first supply voltage; and
    a third capacitive element formed of a transistor disposed in a portion between the first capacitive element and the third power supply wiring, wherein a source and a drain of the transistor receive the third supply voltage and a gate of the transistor receives the first supply voltage,
    wherein the first capacitive element is formed under the first power supply wiring such that the first capacitive element strides over a portion at the second power supply wiring side and a portion at the third power supply wiring side.

2. The semiconductor integrated circuit device of claim 1, wherein the transistor forming the first capacitive element has a gate width greater than that of the transistor forming the second capacitive element.

3. The semiconductor integrated circuit device of claim 1, wherein the transistor forming the first capacitive element has a gate length smaller than that of the transistor forming the second capacitive element.

4. The semiconductor integrated circuit device of claim 1, wherein respective gate lengths of the transistors forming the first capacitive element, the second capacitive element, and the third capacitive element are equal to each other.

5. The semiconductor integrated circuit device of claim 1, wherein the transistor forming the first capacitive element is connected to the second or the third power-supply wiring at the gate.

6. The semiconductor integrated circuit device of claim 1, wherein the gate of the transistor forming the first capacitive element receives the second or the third supply voltage from a TIE portion that is to supply a voltage steadily.

7. The semiconductor integrated circuit device of claim 6, wherein the TIE portion is formed in a first cell including the first capacitive element.

8. The semiconductor integrated circuit device of claim 6, wherein the TIE portion is formed independent of the first cell that includes the first capacitive element.

9. The semiconductor integrated circuit device of claim 6, wherein the TIE portion includes a first conductive type first transistor of which source receives the first supply voltage, and a second conductive type second transistor of which gate and drain are respectively connected to a drain and a gate of the first transistor, and a source of the second transistor receives the second or the third supply voltage, and
    wherein the gate of the transistor forming the first capacitive element is connected to the gate of the first transistor and the drain of the second transistor.

10. The semiconductor integrated circuit device of claim 1, wherein the second and the third supply voltages are equal to each other.

11. The semiconductor integrated circuit device of claim 1, wherein a distance between the first and the second power supply wirings is equal to a distance between the first and the third power supply wirings.

12. The semiconductor integrated circuit device of claim 1, wherein the transistor forming the first capacitive element is a PMOS transistor, of which source and drain receive VDD as the first supply voltage, and of which gate receives VSS as the second or the third supply voltage.

13. The semiconductor integrated circuit device of claim 1, wherein the transistor forming the first capacitive element is an NMOS transistor, of which source and drain receive VSS as the first supply voltage, and of which gate receives VDD as the second or the third supply voltage.

14. The semiconductor integrated circuit device of claim 1, wherein a gate pattern of the transistor forming the second capacitive element includes a plurality of projections projecting towards the second power-supply wiring along a second direction orthogonal to the first direction, and the projections are placed at equal intervals along the first direction and have equal widths along the first direction, and tips of the projections are aligned along the second direction.

15. The semiconductor integrated circuit device of claim 1 comprising a first cell that includes the first capacitive element, and a second cell different from the first cell and including a capacitive element formed of a transistor disposed between the first power-supply wiring and the second power supply wiring.

* * * * *